United States Patent Office 3,796,614 Patented Mar. 12, 1974

3,796,614

METHOD FOR CONTROLLING INTERMETALLIC SEMICONDUCTOR DIFFUSIONS

Jagtar S. Basi, Wappingers Falls, and Vincent J. Lyons, Poughkeepsie, N.Y., assignors to International Business Machines Corporation, Armonk, N.Y.

No Drawing. Filed Dec. 2, 1971, Ser. No. 204,323
Int. Cl. H01l 7/44
U.S. Cl. 148—189 5 Claims

ABSTRACT OF THE DISCLOSURE

The method disclosed describes a procedure for controlling junction depth and surface concentration in diffusion of zinc in gallium arsenide comprising utilizing an alloy of silicon and arsenic wherein the total arsenic present is between about two and fifty atomic percent and utilizing a diffusion temperature between 800 and 1000° C.

BACKGROUND OF THE INVENTION

Field of the invention

This invention relates to a method for controlling the diffusion of zinc in gallium arsenide and, more particularly, to a method whereby zinc diffusions are carried out in gallium arsenide substrates to produce a high surface concentration of zinc in the gallium arsenide and a shallow P-N junction. Further, this invention relates to an improved method of making rectifying barriers in III–V compounds by the diffusion process.

Description of the prior art

Rectifying barriers, also known as P-N junctions, may be fabricated in semiconductor bodies by means of solid state impurity diffusion from a separate phase, often the impurity vapor. In this method, a semicondutcor body is placed in an atmosphere of a conductivity type determining material. Type determining materials are also known as active impurities or doping agents. Molecules of the vaporized type determining material impinge on the surface of the semiconductor. The molecules diffuse into the bulk of the semiconductor for a short distance rather than merely forming a coating or superficial layer upon the surface. The extent of impurity diffusion depends on the temperature, duration period, the concentration of the impurity source, and the diffusion constant of the particular impurity in the particular semiconductor material being utilized. The diffusion process results in the formation of a region parallel to the surface containing the diffused impurity material so that the conductivity of the said region is different from that of the bulk. At the interface between the two regions of different conductivity type, that is between the said region and bulk of the semiconductor body, a rectifying barrier is formed. The semiconductor wafer into which the active impurity is diffused may be of either conductivity type or may also be intrinsic as desired.

It has also been recognized that wide variations in the vapor-source density, i.e., zinc vapor pressure, produce very small changes in surface concentration. Nevertheless, at equal diffusion times and temperatures these small changes in surface concentration produce very large changes in junction depth or depths of diffusion penetration as well as the nature of the zinc distribution.

Similarly, the art has shown that for the same time and temperature of diffusion using the same zinc source, the junction depth decreases as the arsenic pressure increases. Likewise, the zinc diffusion coefficient decreases with the increase of arsenic pressure during the diffusion process. In diffusions of zinc into gallium arsenide, the zinc diffusion coefficient is believed to be dependent on zinc concentration. This dependence is minimized as the arsenic pressure is increased. The diffusivity of zinc in GaAs is controlled not only by temperature, time, and zinc concentration, but also is strongly dependent on the value of the arsenic vapor pressure in the system. Prior art methods describe the control over these variables required to produce P-N junctions; however, those methods encounter severe difficulties when applied to produce a P-N junction having the properties of high zinc surface concentration and shallow junction depth.

A typical type of diffusion process embodies supplying a quantity of impurity material and a semiconductor wafer for enclosure into a sealed quartz tube which has been evacuated to the desired reduced pressure. The tube is then brought to a suitable diffusion temperature in a furnace. The surface concentration is dependent upon the particular wafer and impurity material which are held at the selective diffusion temperature for a suitable time. As a result, atoms of the impurity material diffuse from the vapor phase at the surface of the solid wafer to a depth primarily dependent upon vapor concentration, temperature and time.

Among gallium arsenide devices employing P-N junctions are the incoherent infrared diodes and the injection laser. These two devices are similar in structure and operation. The discovery of the emission of coherent light by the passage of a high electric current through a gallium arsenide semiconductor P-N junction has focused attention upon the quality of the P-N junction including freedom from mechanical and chemical defects, a high degree of planarity and controlled junction depth and surface concentration of the dopant in and upon gallium arsenide substrates. Zinc diffusion in gallium arsenide semiconductor materials is generally used to produce the P-N junction. The prior art methods and techniques for diffusing zinc into gallium arsenide presented significant problems in the control of zinc diffusions at elevated temperatures due principally to the high diffusivity of zinc in gallium arsenide. Similarly, junctions formed were not uniformly flat or exhibited mechanical or chemical defects which limited their effectiveness. Likewise, junction depth and surface concentrations were difficult to control due to a multi-variant nature of the systems.

SUMMARY OF THE INVENTION

It is an object of this invention to provide a new and improved method for diffusing zinc in gallium arsenide semiconductor substrates.

It is a further object of this invention to provide a method for controlling the diffusion of zinc in gallium arsenside substrates whereby the procedure enables one to produce a semiconductor junction possessing a low junction depth and a high surface concentration.

It is a further object of this invention to provide a diffusion control procedure for shallow junction depths through the introduction of a material which will stabilize and control conditions within the diffusion capsule.

It is still a further object of this invention to provide a method for the diffusion of zinc in gallium arsenide substrates and resulting in high dopant surface concentration with a damage-free surface.

These and other objects are accomplished in accordance with the broad aspects of the present invention by providing a method or process for the diffusion of zinc in gallium arsenide which comprises providing a gallium arsenide semiconductor intrinsic or n-conductivity type substrate, a means for enclosing said semiconductor substrate in an evacuated container wherein is provided a homogenized zinc dopant source having associated therewith a silicon arsenic alloy providing above two and up to fifty atomic percent of total arsenic in silicon, and heating the said evacuated container and materials for a time sufficient to diffuse zinc into the gallium arsenide wafer producing a suitable junction depth and a desired surface concentration.

Various zinc dopant sources are available for use, such as elemental zinc, mixtures of zinc and arsenic, zinc diarsenide, zinc diarsenide and arsenic, gallium-zinc alloy, zinc doped silicon dioxide, and a mixture of gallium arsenide, zinc arsenide and zinc diarsenide. However, a preferred zinc diffusion source is a homogenized mixture of zinc and gallium arsenide. A particular procedure for preparing a homogenized Zn source is accomplished by blending 10% by weight of zinc with 90% by weight of gallium arsenide and encapsulating the material in an evacuated capsule followed by heating at 1050° C. for sixteen to twenty-four hours, followed by cooling and removing the material from the capsule and grinding to a powder of about 200 mesh. 0.47 gram of the above material are added to approximately 9.5 grams of gallium arsenide and encapsulated in an evacuated tube and homogenized for sixteen to twenty-four hours at 1050° C., followed by cooling and removal from the capsule. Other homogenized zinc-gallium arsenide may be used in accordance with this invention.

The silicon alloy utilized in accordance with this invention is produced by introducing into a capsule in spaced relationship arsenic and finely divided intrinsic silicon. The capsule is sealed and evacuated and subsequently introduced into a multi-zone furnace. The temperature of the semiconductor material and the dopant material is maintained until equilibrium is substantially achieved in the environment of the capsule. A more detailed description of the method for producing a silicon arsenic alloy of the type contemplated within the scope of this invention is found in copending application Ser. No. 811,931 entitled "Diffusion Source and Method of Producing Same" filed Apr. 1, 1969, now U.S. Pat. No. 3,658,606 and assigned to the same assignee as this application.

The invention is further defined by the following examples wherein a diffusion procedure utilized polished N-type (tin doped, $1-3\times10^{18}$/cc.) gallium arsenide wafers. Prior to subjecting the aforesaid substrates to zinc diffusion, the wafers were washed with trichlorethylene, acetone and deionized water, followed by a one minute etch using a water, hydrogen peroxide and ammonium hydroxide solution in a 2:1:1 respective ration and followed by a deionized water rinsing and a nitrogen drying cycle.

In a controlled series of experiments, gallium arsenide wafers and diffusion sources were sealed under vacuum ($10^{-6}$ torr) with an encapsulation volume of 20–25 ml. for each example. The diffusion runs were carried out at temperatures of between 800 and 1000° C. in a B.t.u. furnace with an 8 to 10 inch flat zone. After the diffusion time had elapsed, the capsule was quickly quenched under cold water.

Surface concentrations of the diffused wafers were determined by the plasma resonance technique. The junction depth was measured using the bevel and stain technique. The P-N junction in the gallium arsenide was easily delineated by 8:1:1 mixture of water, hydrogen fluoride and hydrogen peroxide under a strong light source.

Specific examples illustrating the invention are delineated in the following table where the zinc source is 0.6 gram of a homogenized mixture of zinc and gallium arsenide, the preparation of which is specifically described above, the diffusion temperature is 900° C., and the diffusion time is one hour, respectively, in each example.

| Example No. | As source | Wt. of as source: Grams | Wt. of as source: Milligrams | Wt. of silicone, grams | Surface concentration | Junction depth $x_j$ ($\mu$) |
|---|---|---|---|---|---|---|
| 1 | | | | | $1.6\times10^{20}$ | 11.05 |
| 2 | 2.8% As/Si | 1 | | | $1.28\times10^{20}$ | 3.93 |
| 3 | | | | 1 | $9.24\times10^{19}$ | 10.7 |
| 4 | Elemental As | | 29.5 | 1 | $2.13\times10^{20}$ | 3.3 |
| 5 | do | | 30.7 | | $2.62\times10^{20}$ | 8.3 |
| 6 | | | | | $1.74\times10^{20}$ | 13.4 |
| 7 | 2.8% As/Si | 1 | | | $2.5\times10^{20}$ | 4.2 |
| 8 | Elemental As | | 16.5 | | $2.5\times10^{20}$ | 11.0 |
| 9 | 2.8% As/Si | 1 | | | $3.37\times10^{20}$ | 4.35 |
| 10 | Elemental As | | 72 | | $2.37\times10^{20}$ | 8.4 |
| 11 | | | | | $1.86\times10^{20}$ | 13.7 |
| 12 | 0.42 As/Si | 1 | | | $1.6\times10^{20}$ | 10.4 |

Example 1 illustrates the high junction depth (11.05 microns) resulting from the absence of an external arsenic source, while Example 3 illustrates that silicon per se does not affect the junction depth. Example 2 illustrates the effect of the presence of the silicon arsenic alloy in providing a shallow junction depth and a high surface concentration. This example is confirmed and further illustrated in Examples 7 and 9. Example 4 illustrates the formation of the silicon arsenic alloy in situ and the resulting shallow junction depth and high surface concentration. The use of elemental arsenic external to the zinc diffusion source is illustrated by Example 5 wherein the junction depth varies as the function of the arsenic pressure in the capsule and well known in the prior art.

It is apparent from an examination of the table of examples that as long as the arsenic-silicon alloy remains a single solid solution phase containing no second phase of SiAs, variable junction depths are obtained in accordance with the prior art expectations, namely that junction depth varies with the arsenic pressure in the capsule, as illustrated in Example 12. The presence of the compound SiAs in the alloy together with the silicon-arsenic solid solution affords exact diffusion control as well as the ability to produce shallow junctions. While the effect of SiAs on junction depths is not clearly understood, it has been definitely estabilshed by the aforesaid examples that the presence of small amounts of SiAs alloyed with a solid solution of arsenic in silicon produces improved shallow junctions.

While the invention has been particularly shown and described with reference to the preferred embodiments and examples, it will be understood by those skilled in the art that the foregoing and other changes in form and detail may be made without departing from the spirit and scope of the invention.

What is claimed is:

1. A method for diffusing zinc in gallium arsenide comprising providing gallium arsenide substrates in an evacuated container in the presence of a zinc dopant source and a two-phase alloy system of silicon and arsenic, heating the evacuated container to a temperature between 800° C. and 1000° C. for a period time and cooling to ambient temperature.

2. A method in accordance with claim 1 wherein the said dopant source is primarily zinc.

3. A method in accordance with claim 1 wherein the said two-phase silicon-arsenic system provides between two and fifty atomic percent arsenic.

4. A method in accordance with claim 1 wherein said silicon arsenic alloy is 2.8 atomic percent arsenic in silicon.

5. A method in accordance with claim 1 wherein said evacuated container is heated to a temperature of 900° C.

References Cited

UNITED STATES PATENTS

| | | | |
|---|---|---|---|
| 3,305,412 | 2/1967 | Pizzarello | 148—189 |
| 3,658,606 | 4/1972 | Lyons et al. | 148—189 |
| 3,154,446 | 10/1964 | Jones | 148—189 |
| 3,485,685 | 12/1969 | Casey et al. | 148—189 |

GEORGE T. OZAKI, Primary Examiner

U.S. Cl. X.R.

148—186, 187; 252—62.3 GA